US006967846B2

(12) United States Patent
Chen

(10) Patent No.: US 6,967,846 B2
(45) Date of Patent: Nov. 22, 2005

(54) MODULAR HOUSING STRUCTURE FOR MODEM

(75) Inventor: H. L. Chen, Kaohsiung (TW)

(73) Assignee: Hitron Technologies, Hsinchu (TW)

(*) Notice: Subject to any disclaimer, the term of this patent is extended or adjusted under 35 U.S.C. 154(b) by 103 days.

(21) Appl. No.: 10/407,180

(22) Filed: Apr. 7, 2003

(65) Prior Publication Data

US 2004/0125571 A1 Jul. 1, 2004

(30) Foreign Application Priority Data

Dec. 27, 2002 (TW) .................................... 91221233 U

(51) Int. Cl.[7] ............................................... G06F 1/16
(52) U.S. Cl. ................... 361/715; 361/737; 174/35 R; 211/41.17
(58) Field of Search ............................... 361/683, 737, 361/736, 818, 717–729, 799, 819, 831; 174/16.1, 15.1, 252, 52.1, 35 R, 35 GC, 51, 138 G; 211/41.17; 206/719; 348/375; 257/679; 439/76.1; 312/223.1, 223.2, 223.3

(56) References Cited

U.S. PATENT DOCUMENTS

| | | | | |
|---|---|---|---|---|
| 5,107,404 A | * | 4/1992 | Tam ............................ | 361/818 |
| 5,111,362 A | * | 5/1992 | Flamm et al. .............. | 361/736 |
| 5,187,642 A | * | 2/1993 | Garner et al. ............... | 361/719 |
| 5,373,104 A | * | 12/1994 | Brauer ....................... | 174/52.1 |
| 5,736,782 A | * | 4/1998 | Schairer ..................... | 257/679 |
| 6,205,030 B1 | * | 3/2001 | Price .......................... | 361/737 |
| 6,313,400 B1 | * | 11/2001 | Mosquera et al. ........ | 174/35 R |
| 6,327,156 B1 | * | 12/2001 | Wangen ..................... | 361/759 |
| 6,388,870 B1 | * | 5/2002 | Canova et al. ............. | 361/683 |
| 6,619,966 B2 | * | 9/2003 | Sakurada et al. .......... | 439/76.1 |
| 6,760,074 B1 | * | 7/2004 | Maruyama et al. ........ | 348/375 |

* cited by examiner

Primary Examiner—Michael Datskovskiy
(74) Attorney, Agent, or Firm—Troxell Law Office, PLLC

(57) ABSTRACT

A modular housing structure having: a top casing; a bottom casing, assembled with the top casing, wherein at least a first circuit board is interposed between the top casing and the bottom casing; and a thickening set interposed between the top casing and the bottom casing and assembled with the top casing and the bottom casing via a plurality of fixing elements so as to accommodate other members such that an electronic device having the housing structure meets at least two specifications.

10 Claims, 6 Drawing Sheets

MODULAR HOUSING STRUCTURE FOR MODEM

BACKGROUND OF THE INVENTION

1. Field of the Invention

The present invention generally relates to a modular housing structure and, more particularly, to a modular housing structure for a cable modem or an ADSL (asymmetric digital subscriber line) modem.

2. Description of the Prior Art

Computers have been the most indispensable tools for all kind of purposes from individuals to enterprises. No one can imagine what this world would become of without computers. Moreover, with the rapid development in multi-media, local-area network (LAN) and Internet, the A/V (audio/video) systems used for computers have attracted considerable attention. For an Internet service provider (ISP), a management information system (MIS), etc., multiple computers or multiple servers are usually needed to achieve sharing and allocation of data base.

More particularly, the computer network has stepped forwards to a wide-band era. The wide-band applications include ADSL, cable, etc. In general, the modem for use in wide-band applications has a housing structure that cannot be modified. However, in addition to the sockets for the cable, the telephone and the hub, a PCMCIA interface may often required for wireless network applications. Therefore, the manufacturers have to develop a housing structure for the modem with wireless communication support. In this manner, a new design as well as a new moldboard has to be developed such that the manufacturing cost is undesirably increased.

Accordingly, there is need in providing a modular housing structure for modems such that there is provided plenty of flexibility during fabrication for reduced cost.

SUMMARY OF THE INVENTION

In view of the aforementioned issue, it is the primary object of the present invention to provide a modular housing structure for modems with plenty of flexibility during fabrication for reduced cost.

To achieve the foregoing object, the present invention provides a modular housing structure, comprising: a top casing; a bottom casing, assembled with the top casing, wherein at least a first circuit board is interposed between the top casing and the bottom casing; and a thickening set interposed between the top casing and the bottom casing and assembled with the top casing and the bottom casing via a plurality of fixing elements so as to accommodate other members such that an electronic device having the housing structure meets at least two specifications.

It is preferable that the thickening set further comprises an extended circuit board, on which is disposed a wireless socket for a wireless modem card using the same interface to be plugged in such that the extended circuit board and the wireless modem card are electrically connected.

It is preferable that the wireless socket is a PCMCIA socket for a PCMCIA modem card to be plugged in.

It is preferable that the thickening set is removed such that a thinner housing structure is assembled using the top casing and the bottom casing.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention providing a modular housing structure for a cable modem or an ADSL (asymmetric digital subscriber line) modem can be exemplified but not limited by the preferred embodiments as described hereinafter.

Figure 1:
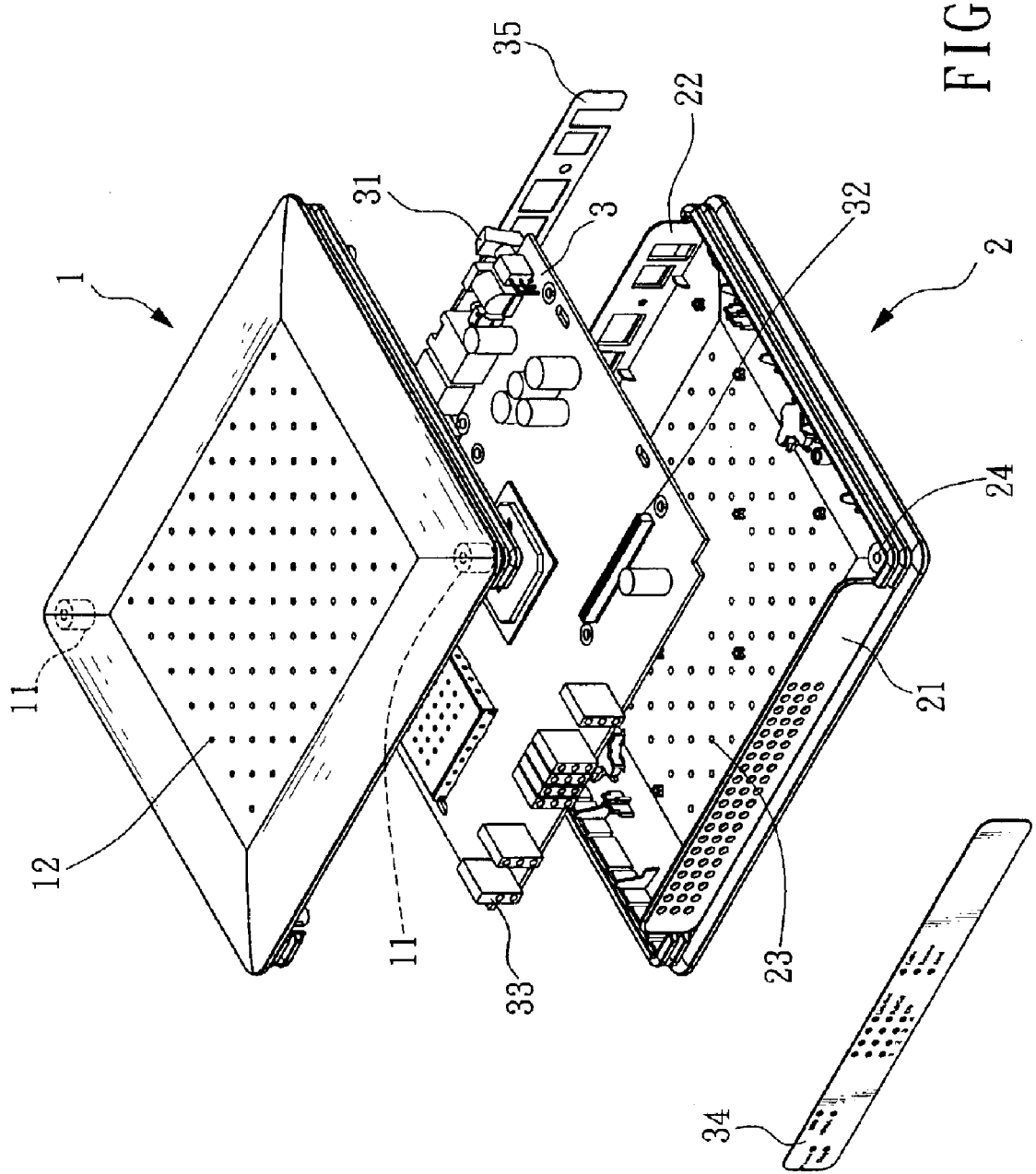
FIG. 1 is an exploded view showing a top casing and a bottom casing of a modular housing structure of a modem according to the present invention.

Please refer to FIG. 1, which is an exploded view showing a top casing and a bottom casing of a modular housing structure of a modem according to the present invention. The top casing 1 with a rectangular shape has at least a first fixing hole(s) 11 and a plurality of heat sinks 12 so as to exhaust heat generated during circuit operation. The bottom casing 2 with a similar appearance as the top casing 1 comprises: a first side plate 21 and a second side plate 22 disposed in parallel on two sides; a plurality of heat sinks 23; and at least a third fixing hole(s) 24 corresponding to the first fixing hole(s) 11.

A first circuit board 3 is interposed between the top casing 1 and the bottom casing 2. A plurality of indicator lights 33 are provided on the first side plate 21 corresponding to the bottom casing 2 so as to display the operation state of the modem. A first panel board 34 is disposed exterior to the first side plate 21. And also, there are provided, on the first panel board 34, a plurality of holes corresponding to the indicator lights 33 such that some of the indicator lights 33 are exposed on the first panel board 34. On the first circuit board 3, a plurality of connecting ports 31 are disposed corresponding to the second side plate 22. The connecting ports 31 include a cable connector, a hub connector, etc. Moreover, a second panel board 35 is disposed exterior to the second side plate 22. Also, some of the connecting ports 31 are exposed on the second panel board 35.

Figure 2A:
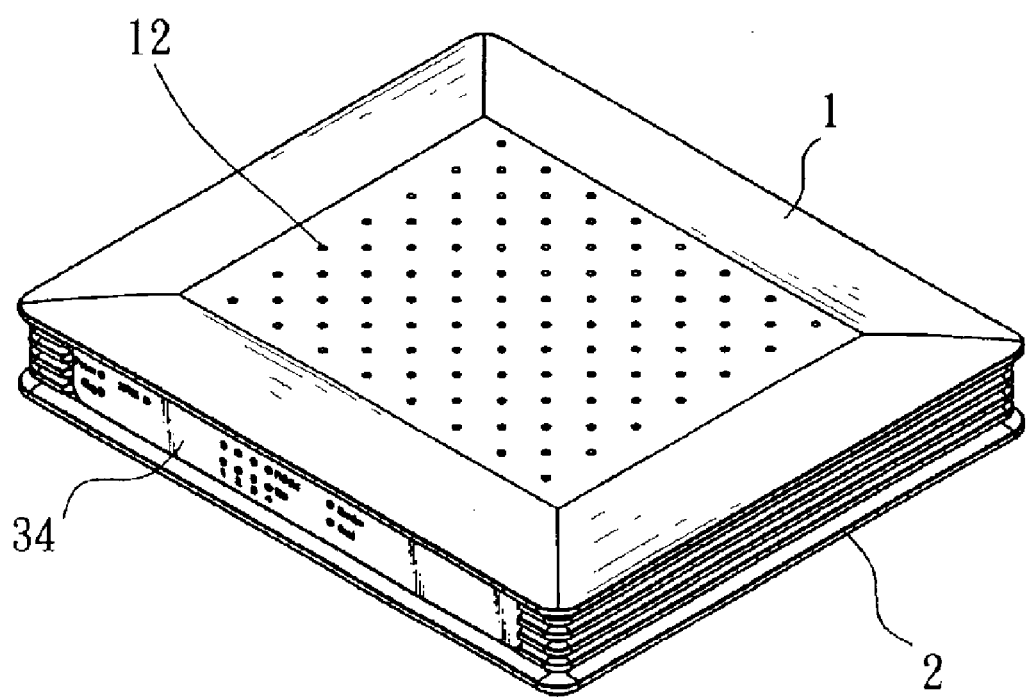
FIG. 2A is a 3-D perspective view showing an assembled modular housing structure of a modem in FIG. 1.
Figure 2B:
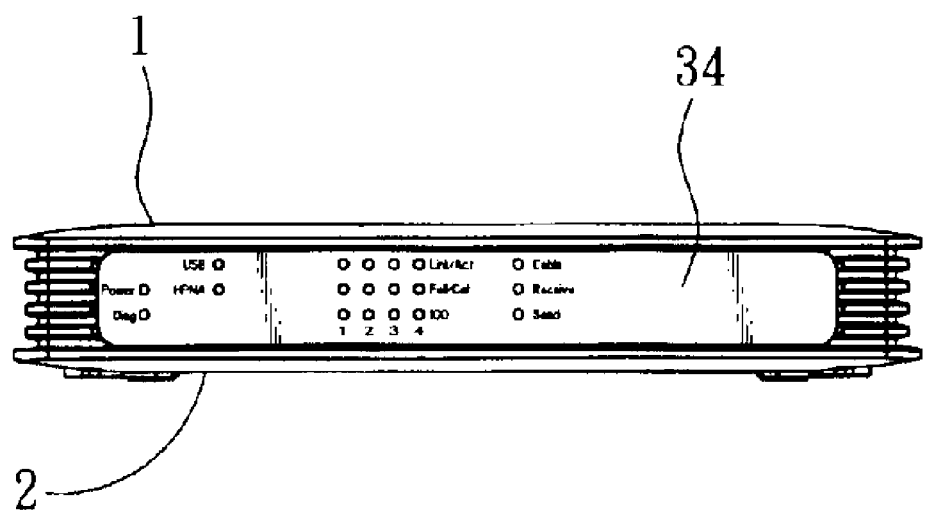
FIG. 2B is a front view showing an assembled modular housing structure of a modem in FIG. 1.
Figure 2C:
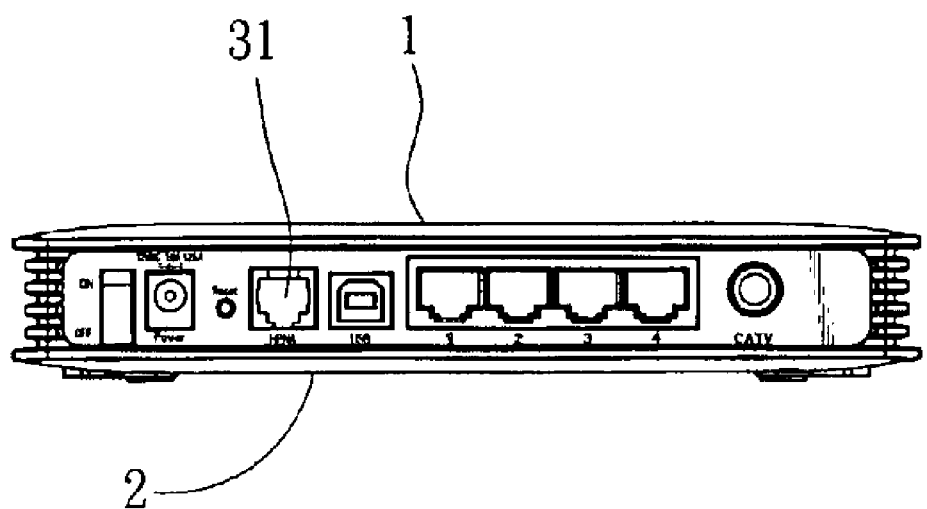
FIG. 2C is a back view showing an assembled modular housing structure of a modem in FIG. 1.
Figure 3:
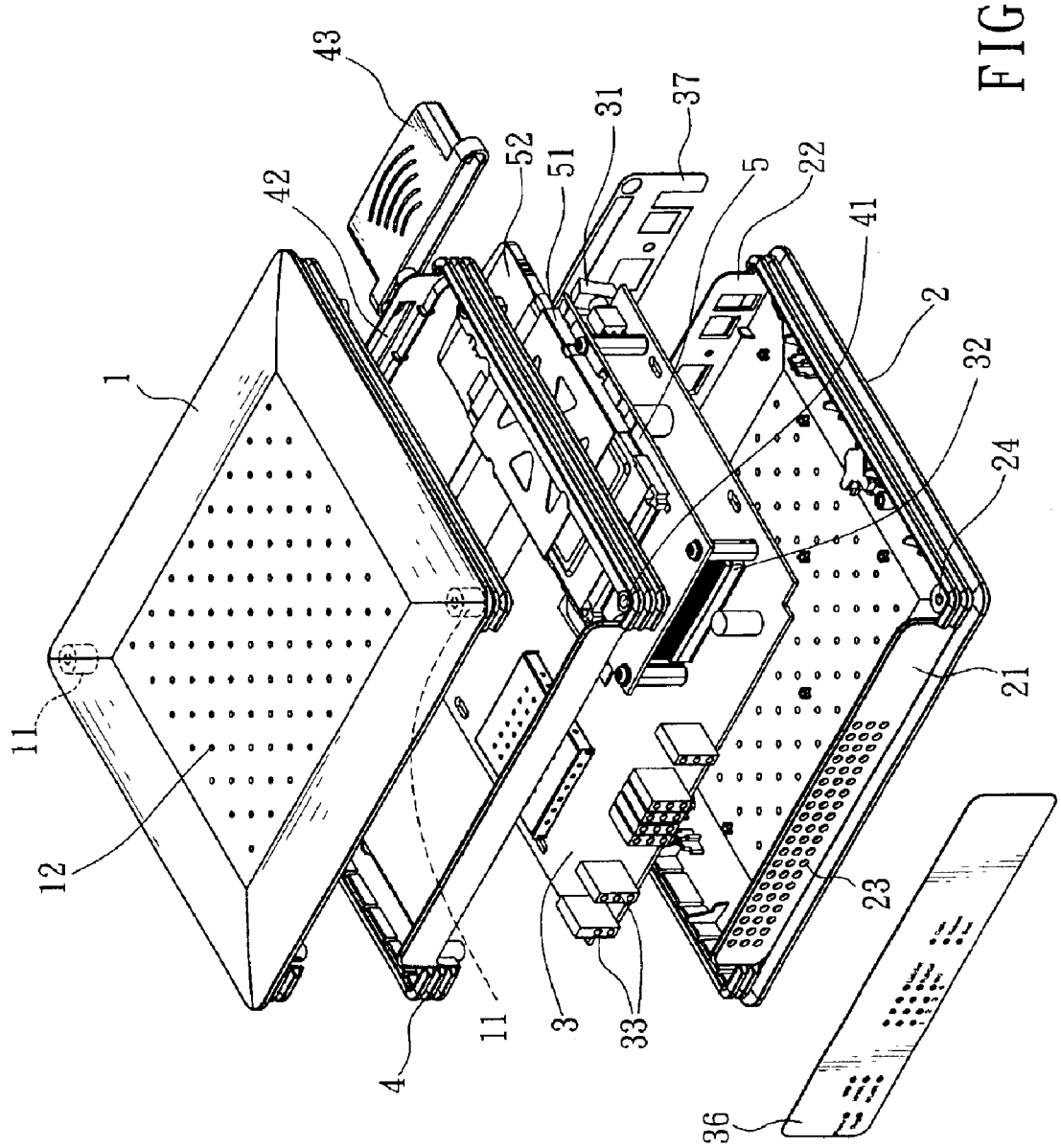
FIG. 3 is an exploded view showing a top casing, a thickening set and a bottom casing of a modular housing structure of a modem in FIG. 1.
Figure 4A:
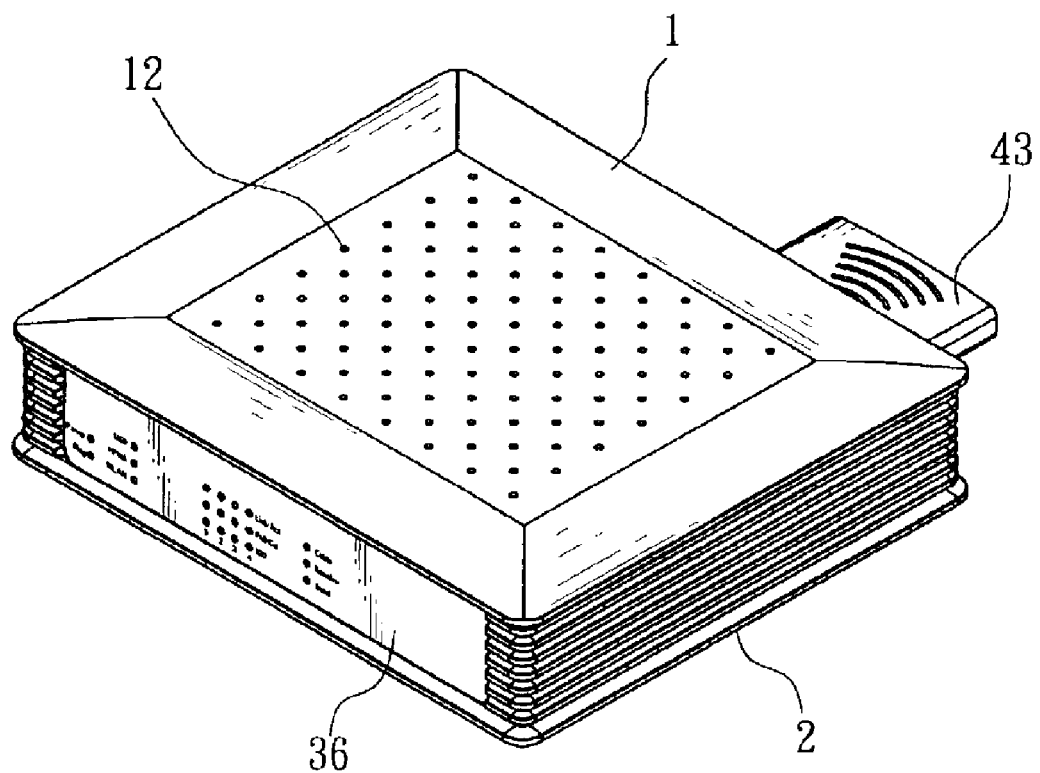
FIG. 4A is a 3-D perspective view showing an assembled modular housing structure of a modem in FIG. 3.
Figure 4B:
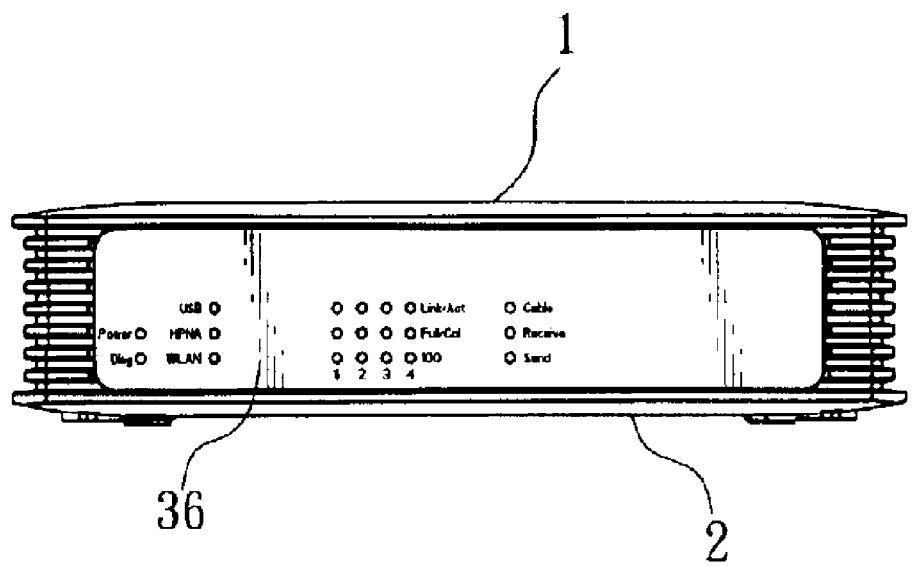
FIG. 4B is a front view showing an assembled modular housing structure of a modem in FIG. 3.
Figure 4C:
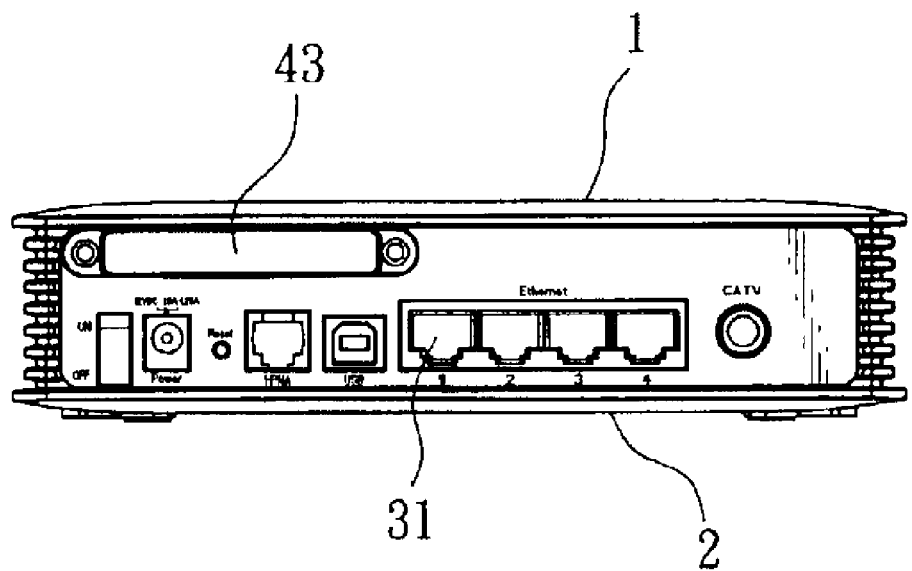
FIG. 4C is a back view showing an assembled modular housing structure of a modem in FIG. 3.

Please refer to FIG. 2A, FIG. 2B, and FIG. 2C, which illustrate, respectively, a 3-D perspective view, a front view and a back view showing an assembled modular housing structure of a modem in FIG. 1. Considering assembling a modular housing structure, the third fixing hole(s) 24 of the bottom casing 2 are solidly attached to the first fixing hole(s) 11 of the top casing 1 by using proper fixing elements (such as screws, not shown) so as to assemble the top casing 1 and the bottom casing 2, thereby forming the modular housing structure. FIG. 1 and FIG. 2 only illustrate an embodiment of the present invention, which does not have a thickening set to increase the overall height of the housing structure of a modem. This is similar to a conventional one. However, in FIG. 3 and FIG. 4, another embodiment of the present invention will be described that a thickening set is interposed between the top casing and the bottom casing and assembled with the top casing and the bottom casing via a plurality of fixing elements so as to accommodate other members such that an electronic device having the housing structure meets at least two specifications.

Please refer to FIG. 3 and FIGS. 4A to 4C. The present embodiment is different from the aforementioned one in that a thickening set 4 is interposed between the top casing 1 and the bottom casing 2 so as to increase the thickness of modem and possibly enlarge the capacity of the modem structure. The thickening set 4 has at least a third fixing hole(s) 24 corresponding to the first fixing hole(s) 11 of the top casing 1 and the third fixing hole(s) 24 of the bottom casing 2. Therefore, the thickening set 4 is solidly assembled with the top casing 1 and the bottom casing 2 by proper elements. Furthermore, a second circuit board 5 can be provided inside the thickening set 4. The second circuit board 5 has a connecting bus 53 plugging into a connecting socket 32 on the first circuit board 3, thereby electrically connecting the first circuit board 3 and the second circuit board 5. The second circuit board 5 has a wireless socket 51 (more particularly, a PCMCIA socket), into which a wireless modem card 52 (more particularly, a PCMCIA modem card) is plugged so as to achieve wireless communication.

Furthermore, in order to fix the second circuit board 5 onto the housing structure, the wireless socket 51 of the second circuit board 5 aligns with an opening 42 on the thickening set 4 and exposes on the side plate of the thickening set 4, in addition to electrically connecting the first circuit board 3 and the second circuit board 5 as aforementioned. Furthermore, both a third panel board 36 and a fourth panel board 37 disposed in parallel are designed to have a larger area. On the fourth panel board 37 is provided an opening corresponding to the wireless socket 51, into which the wireless modem card 52 is plugged. The wireless modem card 52 is covered with a cap 43 so as to prevent the wireless socket 51 and the modem card 52 from contamination.

From FIG. 1 to FIG. 4, it is understood that the structure disclosed in the present invention is implemented by using a thinner modular housing structure comprising a circuit board or a thicker modular housing structure comprising a thickening set having an extended circuit board for wireless communication in addition to a first circuit board. Certainly, those who are skilled in the art can implement the modular housing structure by adding a second circuit board on the first circuit board so as to enlarge the functionality of the modem. In other words, the present invention provides a modular housing structure of a modem that meets at least two specifications. Accordingly, the present invention provides a modular housing structure with reduced cost and increased marketing edge.

The present invention is exemplified by but not limited by the aforementioned embodiments. Moreover, the present invention is useful in other network systems and communication equipments, such as asymmetric digital subscriber line (ADSL), high data rate DSL (HDSL), very high data rate DSL (VDSL), MODEM Series, integrated services digital network (ISDN), access point, VoIP, switches, routers and hubs, etc.

According to the above discussion, the present invention discloses a modular housing structure for modems such that there is provided plenty of flexibility during fabrication for reduced cost. Therefore, the present invention has been examined to be novel, unobvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A modular housing structure, comprising:
   a top casing;
   a bottom casing, assembled with said top casing, wherein at least a first circuit board is interposed between said top casing and said bottom casing; and
   an extended circuit board connected to the first circuit board and having a wireless socket for a wireless modem card, the extended circuit board and the wireless modem card are electrically connected by an interface.

2. The modular housing structure as recited in claim 1, wherein said wireless socket is a PCMCIA socket for a PCMCIA modem card to be plugged in.

3. The modular housing structure as recited in claim 2, wherein said PCMCIA modem card is covered with a cap so s to prevent said wireless socket and said modem card from contamination.

4. A modular housing structure, comprising:
   a top casing;
   a bottom casing, assembled with said top casing, wherein at least a first circuit board is interposed between said top casing and said bottom casing; and wherein said first circuit board comprises at least a connecting socket such that a second circuit board is connected to said connecting socket via a connecting bus, thereby electrically connecting said first circuit board and said second circuit board.

5. A modular housing structure, comprising:
   a top casing;
   a bottom casing, assembled with said top casing, wherein at least a first circuit board is interposed between said top casing and said bottom casing; and wherein a set of panel boards are provided on side plates of the bottom casing and located between said top casing and said bottom casing.

6. The modular housing structure as recited in claim 5, wherein said panel boards have various sizes according to the height of said side plates.

7. The modular housing structure as recited in claim 1, wherein at least a corresponding fixing hole is provided on each of said top casing, said thickening set and said bottom casing such that said top casing, said thickening set and said bottom casing are assembled using fixing elements.

8. The modular housing structure as recited in claim 1, further comprising a thickening set located between the top casing and the bottom casing, the top casing and bottom casing being spaced apart when the thickening set is assembled therebetween.

9. The modular housing structure as recited in claim 4, further comprising a thickening set located between the top casing and the bottom casing, the top casing and bottom casing being spaced apart when the thickening set is assembled therebetween.

10. The modular housing structure as recited in claim 5, further comprising a thickening set located between the top casing and the bottom casing, the top casing and bottom casing being spaced apart when the thickening set is assembled therebetween.

* * * * *